(12) United States Patent
Palanca et al.

(10) Patent No.: US 11,215,477 B2
(45) Date of Patent: Jan. 4, 2022

(54) MOTOR CONTROL SYSTEMS FOR MULTIPLE MOTOR DRIVES

(71) Applicant: Hamilton Sundstrand Corporation, Charlotte, NC (US)

(72) Inventors: Patrick B. Palanca, Rockford, IL (US); Mustansir Kheraluwala, Lake Zurich, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 59 days.

(21) Appl. No.: 16/815,639

(22) Filed: Mar. 11, 2020

(65) Prior Publication Data

US 2021/0285793 A1 Sep. 16, 2021

(51) Int. Cl.
| | | |
|---|---|---|
| G01D 5/12 | (2006.01) | |
| H02P 5/74 | (2006.01) | |
| G05B 19/19 | (2006.01) | |
| G01R 31/28 | (2006.01) | |
| H03F 3/45 | (2006.01) | |
| H02P 6/16 | (2016.01) | |
| H02P 6/00 | (2016.01) | |

(52) U.S. Cl.
CPC .......... G01D 5/12 (2013.01); G01R 31/2829 (2013.01); G05B 19/19 (2013.01); H02P 5/74 (2013.01); H02P 6/00 (2013.01); H02P 6/16 (2013.01); H03F 3/45 (2013.01); *G05B 2219/37481* (2013.01); *G05B 2219/50303* (2013.01); *H03F 2200/234* (2013.01)

(58) Field of Classification Search
CPC .................................. G01D 5/12; H02P 6/00

USPC ..... 318/400.39, 400.38, 400.37, 400.01, 700
See application file for complete search history.

(56) References Cited

U.S. PATENT DOCUMENTS

| | | | |
|---|---|---|---|
| 5,350,988 A | 9/1994 | Le | |
| 5,637,998 A * | 6/1997 | Kushihara | H03M 1/645 |
| | | | 324/207.16 |
| 6,972,700 B2 * | 12/2005 | Kanekawa | B60T 8/885 |
| | | | 318/563 |
| 6,982,530 B2 | 1/2006 | Takeuchi | |
| 7,474,073 B2 | 1/2009 | Sussmeier et al. | |
| 7,834,567 B2 | 11/2010 | Naya et al. | |
| 7,863,850 B2 * | 1/2011 | Fu | G03B 27/42 |
| | | | 318/605 |

(Continued)

FOREIGN PATENT DOCUMENTS

WO 2014/124674 A1 8/2014

OTHER PUBLICATIONS

Motrona Gmbh: "SV 211 Operating Instructions", Feb. 2013 (Feb. 2013), pp. 1-8, XP055817405, 78239 Rielasingen—Germany Retrieved from the Internet: URL:https://www.electro-sensors.com/application/files/1115/2043/9229/Sv211.pdf.

(Continued)

*Primary Examiner* — David Luo
(74) *Attorney, Agent, or Firm* — Locke Lord LLP; Scott D. Wofsy; Daniel J. Fiorello

(57) ABSTRACT

A motor control system can include a resolver configured to output resolver signals and a plurality of motor drives, each motor drive configured to drive a segment of a segmented motor. A resolver signal splitter can be connected between the resolver and the plurality of motor drives to split the resolver signals from the resolver to provide each motor drive with the resolver signals.

17 Claims, 4 Drawing Sheets

(56) References Cited

U.S. PATENT DOCUMENTS 10,505,478 B2    12/2019   Fujita et al.

OTHER PUBLICATIONS

Graeme J G: "Low-Cost Quad Op Amps Boost Circuit Performance", EDN Electrical Design News.(Texas Instrument), Reed Business Information,Highlands Ranch, CO, US, vol. 32, No. 18, Sep. 3, 1987 (Sep. 3, 1987), p. 213, XP000035406.
Extended European search report issued in corresponding EP Application No. 21162138.8 dated Jul. 5, 2021.

* cited by examiner

MOTOR CONTROL SYSTEMS FOR MULTIPLE MOTOR DRIVES

FIELD

This disclosure relates to motor control systems, e.g., for motors comprised of multiple segregated motor.

BACKGROUND

Certain electric motors can include a plurality of motor segments (e.g., separate windings) that require separate motor drives. Traditional systems require a resolver for each motor drive.

Such conventional embodiments have generally been considered satisfactory for their intended purpose. However, there is still a need in the art for improved motor control systems. The present disclosure provides a solution for this need.

SUMMARY

A motor control system can include a resolver configured to output resolver signals and a plurality of motor drives, each motor drive configured to drive a segment of a segmented motor. A resolver signal splitter can be connected between the resolver and the plurality of motor drives to split the resolver signals from the resolver to provide each motor drive with the resolver signals.

The resolver signals include a plurality of signal types. For example, the resolver signals include a cosine signal and a sine signal. The resolver signal splitter can include a sine input and a cosine input, for example.

The resolver signal splitter can include a sine motor drive output assembly for each motor drive connected to sine input and a respective motor drive. The resolver signal splitter can include a cosine motor drive output assembly for each motor drive connected to cosine input and a respective motor drive.

In certain embodiments, each output assembly can be configured to cancel common mode noise. In certain embodiments, each output assembly can include at least one op-amp. In certain embodiments, each input can include a positive line and a negative line, and each output assembly can include a pair of op-amps, the inputs of which are connected in reverse polarity from each other to the positive line and the negative line of each input.

In certain embodiments, the resolver signal splitter can be configured to connect to a signal generator to receive an output excitation signal, and to split the excitation signal to output the excitation signal to each of the motor drives and/or to output the excitation signal to the resolver. The resolver signal splitter can include an excitation input configured to receive the excitation signal from an excitation input assembly. The resolver signal splitter can also include an excitation motor drive output assembly for each motor drive connected to excitation input and a respective motor drive.

The excitation input can include a positive line and a negative line, for example. Each excitation motor drive output assembly can include a pair of op-amps connected in reverse polarity to the positive line and the negative line of each input.

In certain embodiments, the excitation signal input assembly can include a pair of excitation op-amps. The positive line can be connected to an output of the first op-amp and the negative line is connected to an output of the second op-amp.

The excitation signal input assembly can include a transformer. An input of each excitation op-amp of the pair of excitation op-amps can be connected to the transformer in reverse polarity to each other, for example.

In certain embodiments, the system can include the signal generator operatively connected to the resolver signal splitter. In certain embodiments, the system can include the segmented motor. Each segment can be operatively connected to a respective motor drive. The total output of the motor (e.g., a motor shaft) can be connected to the resolver.

In accordance with at least one aspect of this disclosure, a resolver signal splitter can be configured to connect between a single resolver of a segmented motor and a plurality of motor drives. The signal splitter can be configured to split resolver signals from the single resolver to provide each motor drive with the resolver signals to drive each segment of the segmented motor. The resolver signal splitter can include any suitable signal splitter disclosed herein, e.g., as described above.

In accordance with at least one aspect of this disclosure, a method can include receiving a resolver signal from a single resolver of an electric motor, and splitting the resolver signal to output a common resolver signal to a plurality of motor drives. The method can include providing a common sine signal and a common cosine signal to each of the plurality of motor drives. The method can include any other suitable method(s) and/or portion(s) thereof.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
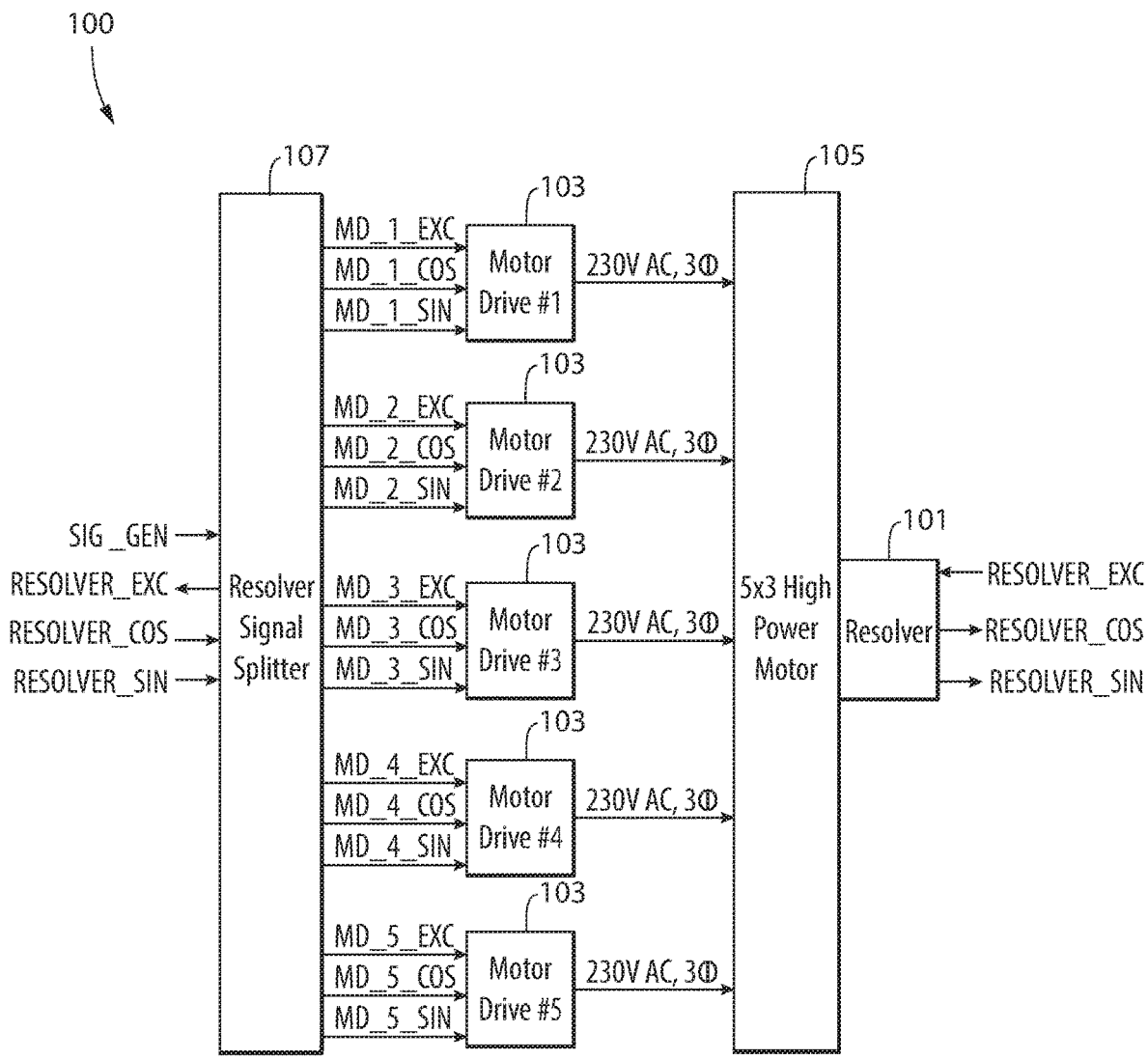
FIG. 1 is a schematic diagram of an embodiment of a system in accordance with this disclosure.
Figure 2A:
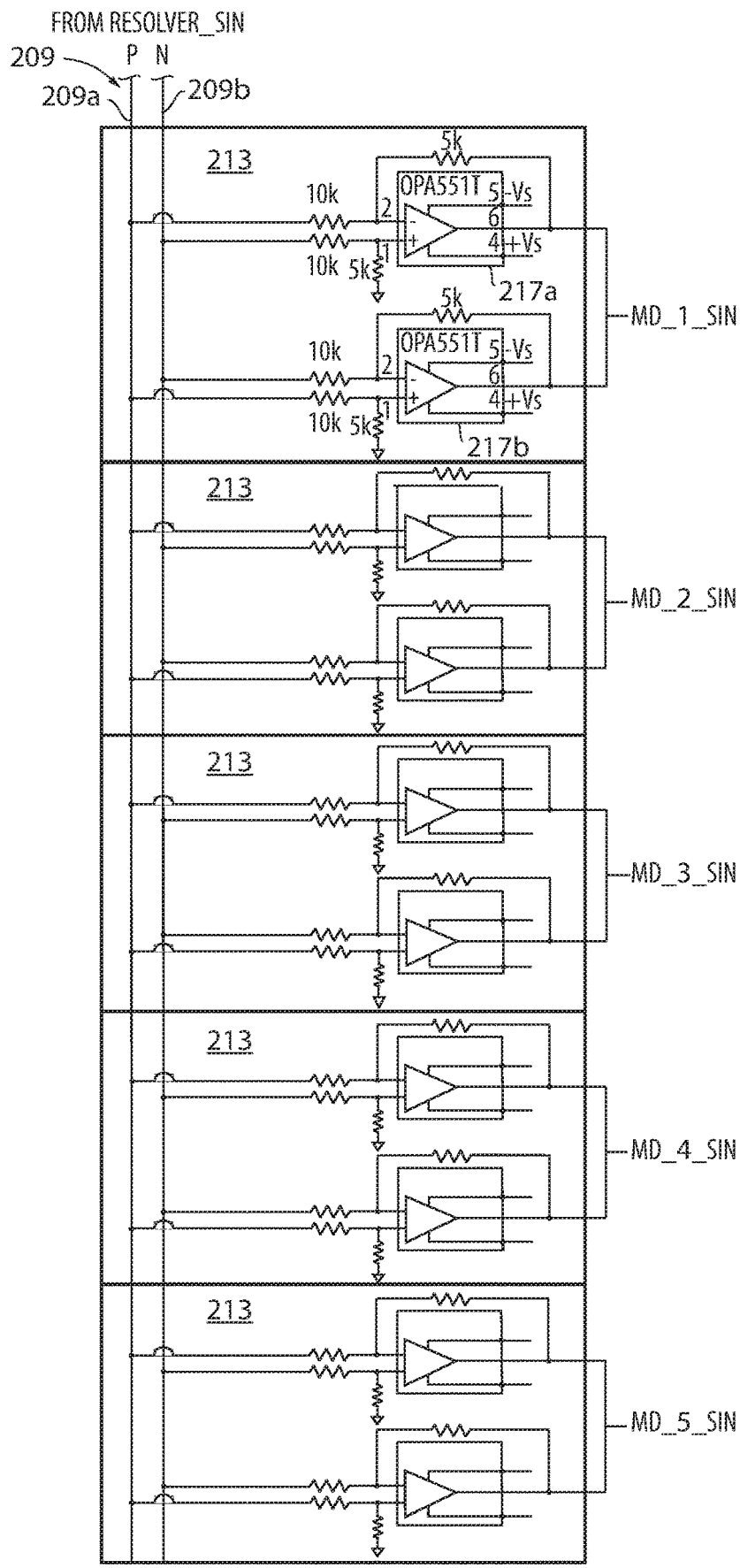
FIGS. 2A-2C show a schematic diagram of an embodiment of a resolver signal splitter in accordance with this disclosure.
Figure 2B:
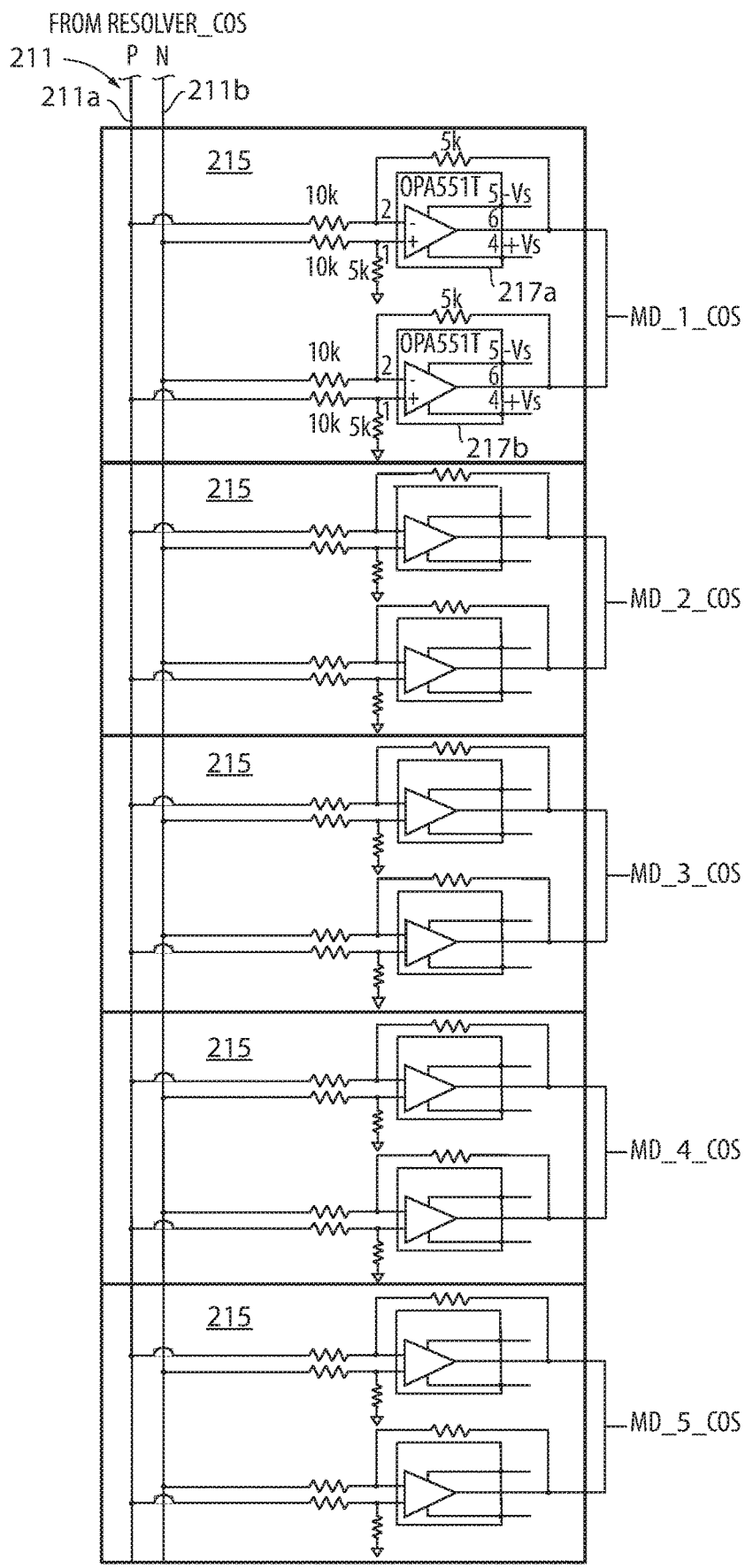
Figure 2C:
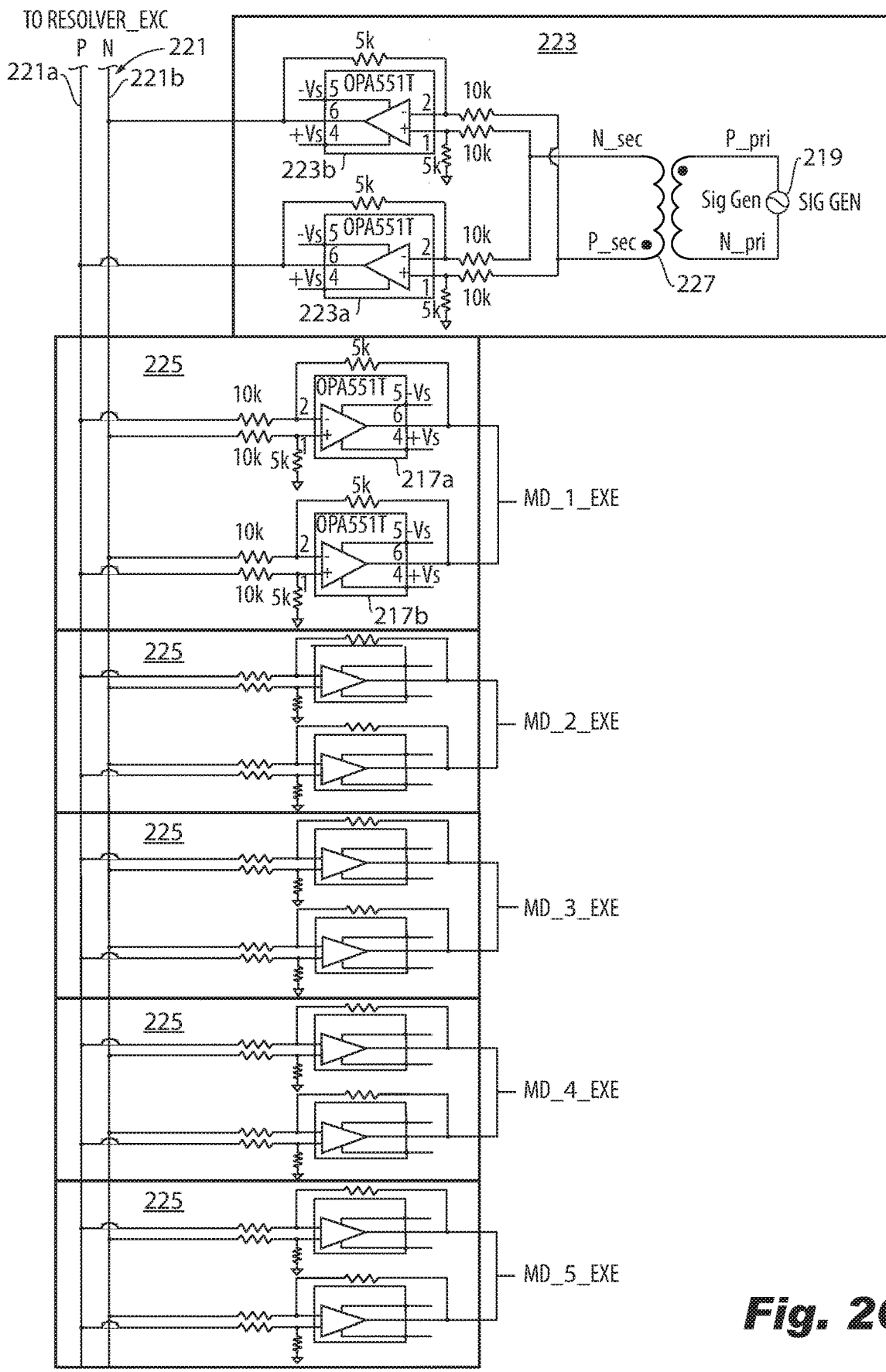

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100. Other embodiments and/or aspects of this disclosure are shown in FIGS. 2A-2C.

Referring to FIG. 1, a motor control system 100 can include a resolver 101 configured to output resolver signals (e.g., RESOLVER_SIN, RESOLVER_COS) and a plurality of motor drives 103 (e.g., five 3-phase motor drives 103 as shown). Each motor drive 103 can be configured to drive a segment (not shown) of a segmented motor 105. Each motor drive 103 and/or any other suitable component described in this disclosure can include any suitable circuitry and/or software module(s) configured to perform any suitable desired function (e.g., disclosed herein).

A resolver signal splitter 107 can be connected between the resolver 101 and the plurality of motor drives 103 to split the resolver signals from the resolver 101 to provide each motor drive 103 with the resolver signals (e.g., MD_N_SIN, MD_N_COS, where N is the motor drive number as shown). In at least some embodiments, the signals output from the signal splitter are all the same such that all motor drives 103 output the same 3 phase control to each respective motor segment.

The resolver signals can include a plurality of signal types. For example, the resolver signals include a cosine signal and a sine signal, e.g., as shown. Referring additionally to FIGS. 2A-2C, the resolver signal splitter 107 (an embodiment of which shown across FIGS. 2A-2C) can include a sine input 209 and a cosine input 211, for example.

The resolver signal splitter 107 can include a sine motor drive output assembly 213, e.g., one for each motor drive 103, connected to sine input 209 and a respective motor drive 103. The resolver signal splitter 107 can include a cosine motor drive output assembly 215, e.g., one for each motor drive, connected to cosine input 211 and a respective motor drive 103.

In certain embodiments, each output assembly 213, 215 can be configured to cancel common mode noise. In certain embodiments, each output assembly 213, 215 can include at least one op-amp 217a, 217b. In certain embodiments, each input 209 can include a positive line 209a, 211a and a negative line 209b, 211b, and each output assembly can include a pair of op-amps 217a, 217b. As shown in FIGS. 2A-2C, the inputs of the pair of op-amps 217a, 217b are connected in reverse polarity from each other to the positive line 209a, 211a and the negative line 209b, 211b of each input 209, 211. For example, as shown, a negative input of the first op-amp 217a can be connected to the positive line 209a, a negative input of the second op-amp 217b can be connected to the negative line 209b, a positive input of the second op-amp 217b can be connected to the positive line 209a, and a positive input of the first op-amp 217a can be connected to the negative line 209b. Any other suitable arrangement (e.g., the reverse) is contemplated herein.

As shown, the one or more op-amps 217a, 217b can include a resistor on each input line, a resistor on a ground line extending from the positive input line, and a resistor on a line between the negative input line and the output line of the op-amp. As appreciated by one having ordinary skill in the art, the op-amp 217a, 217b can include any other suitable type of amplifier circuitry, additionally or alternatively. The op-amp 217a, 217b can include any suitable power source for powering the amplifier.

In certain embodiments, the resolver signal splitter 107 can be configured to connect to a signal generator 219 to receive an input excitation signal (e.g., SIG GEN), and to split the excitation signal to output the excitation signal to each of the motor drives 103 and/or to output the excitation signal to the resolver 101. As shown in FIGS. 2A-2C, the resolver signal splitter 107 can include an excitation input 221 configured to receive the excitation signal from an excitation input assembly 223. The resolver signal splitter 107 can include the excitation input assembly 223, or any suitable portions thereof. The resolver signal splitter 107 can also include an excitation motor drive output assembly 225, e.g., one for each motor drive 103, connected to excitation input 221 and a respective motor drive 103.

The excitation input 221 can include a positive line 221a and a negative line 221b, for example. Each excitation motor drive output assembly 225 can be the same or similar to the motor drive output assemblies 215. For example, the excitation motor drive output assemblies 225 can include a pair of op-amps 217a, 217b (e.g., as described above) connected in reverse polarity to the positive line and the negative line of each input, e.g., similar or the same as described above with respect to the assemblies 213, 215. Any other suitable arrangement is contemplated herein.

In certain embodiments, the excitation signal input assembly 223 can include a pair of excitation op-amps 223a, 223b. The excitation op-amps 223a, 223b can be the same as or different from the op-amps 217a, 217b described above. The excitation op-amps 223a, 223b can be configured to buffer the excitation signal from signal generator 219 and provide suitable amplification to the excitation signal to be used by the plurality of motor drives 103 and the resolver 101. In certain embodiments, the positive line 221a can be connected to an output of the first op-amp 223a and the negative line 221b can be connected to an output of the second op-amp 223b, e.g., as shown. Any other suitable arrangement (e.g., the reverse) is contemplated herein.

The excitation signal input assembly 223 can include a transformer 227. An input of each excitation op-amp 223a, 223b of the pair of excitation op-amps 223a, 223b can be connected to the transformer 227 in reverse polarity to each other, for example, e.g., as shown (e.g., similar to the inputs of op-amps 217a, 217b).

In certain embodiments, the system 100 can include the signal generator 219 operatively connected to the resolver signal splitter 107. In certain embodiments, the system 100 can include the segmented motor 105. Each segment can be operatively connected to a respective motor drive 103. The total output of the motor 105 (e.g., a motor shaft) can be connected to the resolver 101. Any number of resolvers 101 are contemplated herein, however, it is contemplated that at least one resolver 101 can be configured to provide a common signal to a plurality of motor drives 103.

Embodiments disclosed herein can include any other suitable circuitry, for example. Any suitable arrangement is contemplated herein.

In accordance with at least one aspect of this disclosure, a resolver signal splitter (e.g., 107) can be configured to connect between a single resolver (e.g., 101) of a segmented motor (e.g., 105) and a plurality of motor drives (e.g., 103). The signal splitter can be configured to split resolver signals from the single resolver to provide each motor drive with the resolver signals to drive each segment of the segmented motor. The resolver signal splitter can include any suitable signal splitter disclosed herein, e.g., as described above.

In accordance with at least one aspect of this disclosure, a method can include receiving a resolver signal from a single resolver of an electric motor, and splitting the resolver signal to output a common resolver signal to a plurality of motor drives. The method can include providing a common sine signal and a common cosine signal to each of the plurality of motor drives. The method can include any other suitable method(s) and/or portion(s) thereof.

Certain motors (e.g., high power motors) can be comprised of multiple smaller 3-phase motors integrated into a single rotor and a single stator. A resolver outputs sine and cosine signals which indicate rotational position of the motor. Embodiments allow one resolver to work with multiple motors and the output of, e.g., a single resolver to be used by a plurality of motor drives.

Certain embodiments of a signal splitter can include pairs of differential amplifiers for each output assembly to each motor drive. Certain embodiments can output a certain gain total and cancel common mode noise. Certain embodiments, however, can utilize a single amplifier (e.g., a single differential amplifier) if desired, e.g., if common mode noise is not an issue.

Embodiments can also include a pair of excitation signal op-amps that buffer and isolate the devices to control electrical signals to properly provide electrical signals to each devices (e.g., resolver, motor drives). Embodiments having a signal splitter can be agnostic to the type of motor drive and can allow use of off the shelf drives. Embodiments can include a power supply for each op-amp, which can be integral with the signal splitter or external.

Multiple modularized, low power 3-phase motor drives can be used to drive a multi 3-phase segmented high power motor (e.g. 5×3-phase), with a single position resolver. In certain embodiments, each motor drive must receive/transmit isolated/buffered resolver signals, for example, and the resolver excitation, sine, and cosine signals must be split while also having enough power to drive the resolver interface circuits in each motor drive.

Embodiments can include a resolver splitter board to provide the resolver signal excitation, sine, and cosine to each motor drive. Embodiments, can use a pair of differential amplifier for each resolver signal going to the motor drive. Excitation signal can be created using an external signal generator or an internal PWM (pulse width modulation) circuit with active low pass filters, for example. Embodiments can be easily configured to interface with any high power motor (e.g., 5 segmented 3-phase motor sectors).

Embodiments allow each motor drive to share the same resolver excitation, sine, and cosine. Each motor drive can receive/transmit isolated/buffered resolver signals. The resolver excitation, sine, and cosine signals can be split and have enough power to drive the resolver interface circuits in each motor drive. Embodiments present a solution on the resolver splitter interface between a single resolver and multiple motor drives.

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A motor control system, comprising: a resolver configured to output resolver signals; a plurality of motor drives, each motor drive configured to drive a segment of a segmented motor; and a resolver signal splitter connected between the resolver and the plurality of motor drives to split the resolver signals from the resolver to provide each motor drive with the resolver signals wherein the resolver signal splitter includes a sine input and a cosine input, wherein the resolver signal splitter includes a sine motor drive output assembly for each motor drive connected to sine input and a respective motor drive, wherein the resolver signal splitter includes a cosine motor drive output assembly for each motor drive connected to cosine input and a respective motor drive.

2. The system of claim 1, wherein the resolver signals include a plurality of signal types.

3. The system of claim 1, wherein the resolver signals include a cosine signal and a sine signal.

4. The system of claim 1, wherein each output assembly is configured to cancel common mode noise.

5. The system of claim 1, wherein each output assembly includes at least one op-amp.

6. The system of claim 5, wherein each input includes a positive line and a negative line, wherein each output assembly includes a pair of op-amps, the inputs of which are connected in reverse polarity from each other to the positive line and the negative line of each input.

7. A motor control system, comprising: a resolver configured to output resolver signals; a plurality of motor drives, each motor drive configured to drive a segmented motor; and a resolver signal splitter connected between the resolver and the plurality of motor drives to split the resolver signals from the resolver to provide each motor drive with the resolver signals wherein the resolver signal splitter includes a sine input and a cosine input, wherein the resolver signal splitter is configured to connect to a signal generator to receive an input excitation signal, and to split the excitation signal to output the excitation signal to each of the motor drives and/or to output the excitation signal to the resolver.

8. The system of claim 7, wherein the resolver signal splitter includes an excitation input configured to receive the excitation signal from an excitation input assembly and an excitation motor drive output assembly for each motor drive connected to excitation input and a respective motor drive.

9. The system of claim 8, wherein the excitation input includes a positive line and a negative line, wherein each excitation motor drive output assembly includes a pair of op-amps connected in reverse polarity to the positive line and the negative line of each input.

10. The system of claim 9, wherein the excitation signal input assembly includes a pair of excitation op-amps, wherein the positive line is connected to an output of the first op-amp and the negative line is connected to an output of the second op-amp.

11. The system of claim 10, wherein the excitation signal input assembly includes a transformer, wherein an input of each excitation op-amp of the pair of excitation op-amps are connected to the transformer in reverse polarity to each other.

12. The system of claim 11, further comprising the signal generator operatively connected to the resolver signal splitter.

13. A resolver signal splitter configured to connect between a single resolver of a segmented motor and a plurality of motor drives, the signal splitter configured to split resolver signals from the single resolver to provide each motor drive with the resolver signals to drive each segment of the segmented motor, wherein the resolver signal splitter includes a sine motor drive output assembly for each motor drive connected to sine input and a respective motor drive, wherein the resolver signal splitter includes a cosine motor drive output assembly for each motor drive connected to cosine input and a respective motor drive.

14. The resolver signal splitter of claim 13, the resolver signals include a cosine signal and a sine signal, wherein the resolver signal splitter includes a sine input and a cosine input, wherein the resolver signal splitter includes a sine motor drive output assembly for each motor drive connected to sine input and a respective motor drive, wherein the resolver signal splitter includes a cosine motor drive output assembly for each motor drive connected to cosine input and a respective motor drive, wherein each input includes a positive line and a negative line, wherein each output assembly includes a pair of op-amps, the inputs of which are connected in reverse polarity from each other to the positive line and the negative line of each input.

15. The resolver signal splitter of claim 14, wherein the resolver signal splitter is configured to connect to a signal generator to receive an input excitation signal, and to split the excitation signal to output the excitation signal to each of the motor drives and to output the excitation signal to the resolver, wherein the resolver signal splitter includes an excitation input configured to receive the excitation signal from an excitation input assembly and an excitation motor drive output assembly for each motor drive connected to excitation input and a respective motor drive, wherein the excitation input includes a positive line and a negative line, wherein each excitation motor drive output assembly includes a pair of op-amps connected in reverse polarity to the positive line and the negative line of each input.

16. A method, comprising: receiving a resolver signal from a single resolver of an electric motor; and splitting the resolver signal to output a common resolver signal to a plurality of motor drives, wherein the resolver signal splitter includes a sine motor drive output assembly for each motor drive connected to sine input and a respective motor drive, wherein the resolver signal splitter includes a cosine motor drive output assembly for each motor drive connected to cosine input and a respective motor drive.

17. The method of claim 16, further comprising providing a common sine signal and a common cosine signal to each of the plurality of motor drives.

* * * * *